(12) United States Patent
Hayashi et al.

(10) Patent No.: US 12,327,708 B2
(45) Date of Patent: Jun. 10, 2025

(54) CHARGED PARTICLE BEAM DEVICE AND ABERRATION CORRECTION METHOD

(71) Applicant: Hitachi High-Tech Corporation, Tokyo (JP)

(72) Inventors: Shingo Hayashi, Tokyo (JP); Hideto Dohi, Tokyo (JP); Zhaohui Cheng, Tokyo (JP); Hideyuki Kazumi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 362 days.

(21) Appl. No.: 17/778,526

(22) PCT Filed: Nov. 21, 2019

(86) PCT No.: PCT/JP2019/045623
§ 371 (c)(1),
(2) Date: May 20, 2022

(87) PCT Pub. No.: WO2021/100172
PCT Pub. Date: May 27, 2021

(65) Prior Publication Data
US 2022/0415605 A1 Dec. 29, 2022

(51) Int. Cl.
*H01J 37/153* (2006.01)
*H01J 37/244* (2006.01)
*H01J 37/28* (2006.01)

(52) U.S. Cl.
CPC .......... *H01J 37/153* (2013.01); *H01J 37/244* (2013.01); *H01J 37/28* (2013.01); *H01J 2237/1534* (2013.01); *H01J 2237/24514* (2013.01)

(58) Field of Classification Search
None
See application file for complete search history.

(56) References Cited

U.S. PATENT DOCUMENTS

| | | | |
|---|---|---|---|
| 9,793,088 B2 * | 10/2017 | Sawada | H01J 37/26 |
| 2006/0169895 A1 | 8/2006 | Honda et al. | |
| 2015/0060654 A1 | 3/2015 | Urano et al. | |

FOREIGN PATENT DOCUMENTS

| | | | |
|---|---|---|---|
| JP | 56-88246 A | | 7/1981 |
| JP | 56088246 A | * | 7/1981 |

(Continued)

OTHER PUBLICATIONS

International Search Report (PCT/ISA/210) issued in PCT Application No. PCT/JP2019/045623 dated Feb. 18, 2020 with English translation (five (5) pages).

(Continued)

*Primary Examiner* — Andrew Smyth
(74) *Attorney, Agent, or Firm* — Crowell & Moring LLP

(57) ABSTRACT

A charged particle optical system includes an aberration corrector 209 that corrects aberration of a charged particle beam and has multipoles of a plurality of stages. The aberration corrector generates a plurality of multipole fields in a superimposed manner for each of the multipoles of the plurality of stages in order to correct the aberration of the charged particle beam. In order to reduce the influence of a parasitic field due to distortion of the multipole, for a first multipole field to be generated in a multipole of any stage among the plurality of stages, a value of a predetermined correction voltage or correction current to be applied to a plurality of poles for generating the first multipole field is corrected so as to eliminate movement of an observation image obtained based on electrons detected from a detector 215 by irradiating a sample with the charged particle beam before and after the first multipole field is generated.

8 Claims, 9 Drawing Sheets

(56) References Cited

FOREIGN PATENT DOCUMENTS

| JP | 2002-93357 A | | 3/2002 |
|---|---|---|---|
| JP | 2005181878 A | * | 7/2005 |
| JP | 2006114305 A | * | 4/2006 |
| JP | 2006-140119 A | | 6/2006 |
| JP | 2006216299 A | * | 8/2006 |
| JP | 2013-149492 A | | 8/2013 |

OTHER PUBLICATIONS

Japanese-language Written Opinion (PCT/ISA/237) issued in PCT Application No. PCT/JP2019/045623 dated Feb. 18, 2020 (six (6) pages).
English translation of International Preliminary Report on Patentability (PCT/IPEA/409) issued in PCT Application No. PCT/JP2019/045623 dated Apr. 5, 2021 (three (3) pages).

* cited by examiner

FIG. 4

| ABERRATION NAME | | FIRST STAG | SECOND STAG | THIRD STAG | FOURTH STAG |
|---|---|---|---|---|---|
| PRIMARY ABERRATION | C1 | × | 4-POLE FIELD | 4-POLE FIELD | × |
| | ReA1 | × | 4-POLE FIELD | 4-POLE FIELD | × |
| | ImA1 | OBLIQUE 4-POLE FIELD | × | × | OBLIQUE 4-POLE FIELD |
| SECONDARY ABERRATION | ReA2 | 6-POLE FIELD | × | × | 6-POLE FIELD |
| | ImA2 | OBLIQUE 6-POLE FIELD | × | × | × |
| | ReB2 | 6-POLE FIELD | 6-POLE FIELD | × | 6-POLE FIELD |
| | ImB2 | OBLIQUE 4-POLE FIELD | × | OBLIQUE 4-POLE FIELD | OBLIQUE 4-POLE FIELD |
| TERTIARY ABERRATION | C3 | 8-POLE FIELD | 8-POLE FIELD | 8-POLE FIELD | 8-POLE FIELD |
| | ReS3 | × | 8-POLE FIELD | 8-POLE FIELD | × |
| | ReA3 | 8-POLE FIELD | × | × | 8-POLE FIELD |
| | ImA3 | OBLIQUE 8-POLE FIELD | × | × | OBLIQUE 8-POLE FIELD |

401

CHARGED PARTICLE BEAM DEVICE AND ABERRATION CORRECTION METHOD

TECHNICAL FIELD

The present invention relates to a charged particle beam device and an aberration correction method of a charged particle beam device including an aberration correction device.

BACKGROUND ART

In a semiconductor manufacturing process of a semiconductor device in which miniaturization is progressed, dimension measurement of a pattern shape of a sample and defect inspection are performed by using a charged particle beam device. A scanning electron microscope (SEM) used for the dimension measurement and the defect inspection can scan a sample surface with a narrow electron beam in vacuum, detect secondary electrons emitted from the sample, and display an enlarged image of the sample surface on a monitor. Since signal intensity of the secondary electrons emitted from the sample changes according to the pattern shape of the sample at an incident position of the electron beam, the SEM can detect fine irregularities on the sample surface as the magnitude of the signal intensity.

The electron beam is influenced by chromatic aberration caused by variation in energy of electrons, geometric aberration represented by spherical aberration, diffraction aberration caused by waviness of electrons, and the like, and is not focused at one point. Since a beam diameter of the electron beam increases as the influence of the aberration increases, a resolution of the SEM image decreases. In an electron beam having a low-acceleration voltage used for the dimension measurement and the defect inspection, the influence of the aberration is particularly large. In order to reduce the influence of these aberrations, in some scanning electron microscopes for inspection or measurement devices capable of acquiring high-resolution SEM images, an aberration corrector that corrects chromatic aberrations and geometric aberrations is mounted.

The aberration corrector includes multipoles of multi-stages, and generates a plurality of types of multipole fields in a superimposed manner in the multipoles to correct aberrations. However, the multipole field generated by the aberration corrector is sensitive to manufacturing variations such as processing, assembly, and power output of the aberration corrector, and a distribution of the multipole field generated by the aberration corrector deviates from a theoretically defined field distribution (hereinafter, this deviation is referred to as distortion of the multipole). When there is distortion of the multipole, aberration correction according to theory cannot be performed.

PTL 1 discloses a configuration in which "a device having an aberration corrector including multipoles mounted thereon includes a parasitic dipole field correction device and a parasitic 4-pole field correction device that are provided to correct a parasitic dipole field and a parasitic 4-pole field generated by mechanical and electrical deviation of the multipole when a sample surface is observed by using charged particles, storage means for storing a correction value when a multipole field of a certain stage of the aberration corrector is shifted by a predetermined amount in X and Y directions in advance, and correction means for correcting the parasitic dipole field and the parasitic 4-pole field by using a correction amount stored in the storage means".

PTL 2 describes that "an aberration correction amount is calculated by measuring an aberration coefficient of an optical system constituting a charged particle beam device. At the same time, a current value of a power supply control value to be applied to an aberration corrector is measured. A parasitic aberration adjustment amount for suppressing a parasitic aberration amount generated in the aberration corrector is calculated based on the aberration correction amount and the current value of the power supply control value".

CITATION LIST

Patent Literature

PTL 1: JP 2006-114305 A
PTL 2: JP 2013-149492 A

SUMMARY OF INVENTION

Technical Problem

In the related art, the distortion of the multipole included in the aberration corrector is regarded as a parasitic field, and the parasitic field is expanded to a plurality of parasitic multipole fields. The techniques described in PTL 1 and PTL 2 also reduce the influence of the distortion of the multipole in accordance with this idea.

In PTL 1, the parasitic field is expanded to the parasitic dipole field and the parasitic 4-pole field to correct the parasitic field. Thus, a parasitic dipole field correction amount and a parasitic 4-pole field correction amount per unit intensity of the multipole field are stored for each multipole in advance, and thus, the multipole field is generated after the parasitic dipole field and the parasitic 4-pole field are generated.

In PTL 2, when a relationship of the parasitic aberration correction amount with respect to the multipole field intensity changes depending on the multipole field intensity, even though the relationship changes with time, the parasitic aberration correction amount is determined in consideration of the influence.

In either case, the correction amount is determined according to the intensity of the multipole field to be generated by the multipole. However, according to the study of the inventors, an aberration measurement error is included in measurement data of the aberration amount in proportion to the aberration amount. Accordingly, when the correction amount is determined according to the intensity of the generated multipole field, the correction amount for correcting the parasitic field due to the aberration measurement error deviates from the originally required correction amount, and thus, the accuracy of the aberration correction decreases.

The present invention has been made in view of the above problems, and achieves highly accurate aberration correction by directly suppressing a parasitic field due to distortion of a multipole in a charged particle beam device including an aberration corrector without determining a correction amount according to intensity of a multipole field.

Solution to Problem

There is provided a charged particle beam device which is an aspect of the present invention including a charged particle optical system which irradiates a sample with a charged particle beam from a charged particle source, a detector which detects electrons emitted by an interaction between the charged particle beam and the sample, and a controller. The charged particle optical system includes an aberration corrector which corrects aberration of the charged particle beam and has multipoles of a plurality of stages, the multipole includes a plurality of poles, and generates a predetermined multipole field by applying a predetermined correction voltage or correction current to the plurality of poles, the aberration corrector is capable of generating a plurality of multipole fields in a superimposed manner in the multipoles of the plurality of stages in order to correct the aberration of the charged particle beam, and the controller corrects, for a first multipole field to be generated in a multipole of any stage among the plurality of stages, a value of the predetermined correction voltage or correction current to be applied to the plurality of poles for generating the first multipole field so as to eliminate movement of an observation image obtained based on the electrons detected from the detector by irradiating the sample with the charged particle beam before and after the first multipole field is generated.

There is provided an aberration correction method of a charged particle beam device which is another aspect of the present invention. The charged particle beam device includes an aberration corrector which corrects aberration of a charged particle beam, a detector which detects electrons emitted by an interaction between the charged particle beam and a sample, and a controller which controls the aberration corrector, the aberration corrector includes multiples of a plurality of stages, the multipole includes a plurality of poles, and generates a predetermined multipole field by applying a predetermined correction voltage or correction current to the plurality of poles, an aberration correction table for calculating a theoretical value of the correction current or correction voltage to be applied to the plurality of poles of the multipole of the aberration corrector in order to correct the aberration of the charged particle beam and a distortion correction table for calculating a correction value of the correction current or correction voltage to be applied to the plurality of poles of the multipole of the aberration corrector in order to correct distortion of the multipole of the aberration corrector are stored, and the controller measures the aberration of the charged particle beam, obtains the theoretical value of the correction current or correction voltage to be applied to the plurality of poles of the multipole of the aberration corrector in order to correct the aberration of the charged particle beam by using the measured aberration of the charged particle beam and the aberration correction table, obtains, for each of the plurality of multipole fields to be generated in the multipoles of the plurality of stages, a shift of an observation image obtained based on the electrons detected from the detector by irradiating the sample with the charge particle beam before and after the multipole field is generated, and obtains the correction value of the correction current or correction voltage to be applied to the plurality of poles of the multipole in order to generate the multipole field by using the shift of the observation image and the distortion correction table, and obtains the correction current or correction voltage to be applied to the plurality of poles of the multipoles of the plurality of stages by correcting the theoretical value by the correction value.

Advantageous Effects of Invention

Even when there is distortion of the multipole, the aberration correction can be performed with high accuracy by directly suppressing the parasitic field.

Other objects, and novel features will be apparent from the description of the present specification and the accompanying drawings.

BRIEF DESCRIPTION OF DRAWINGS

FIG. 4 is a diagram illustrating types of multipole fields to be generated by the aberration corrector for each multipole.

DESCRIPTION OF EMBODIMENTS

Figure 1:
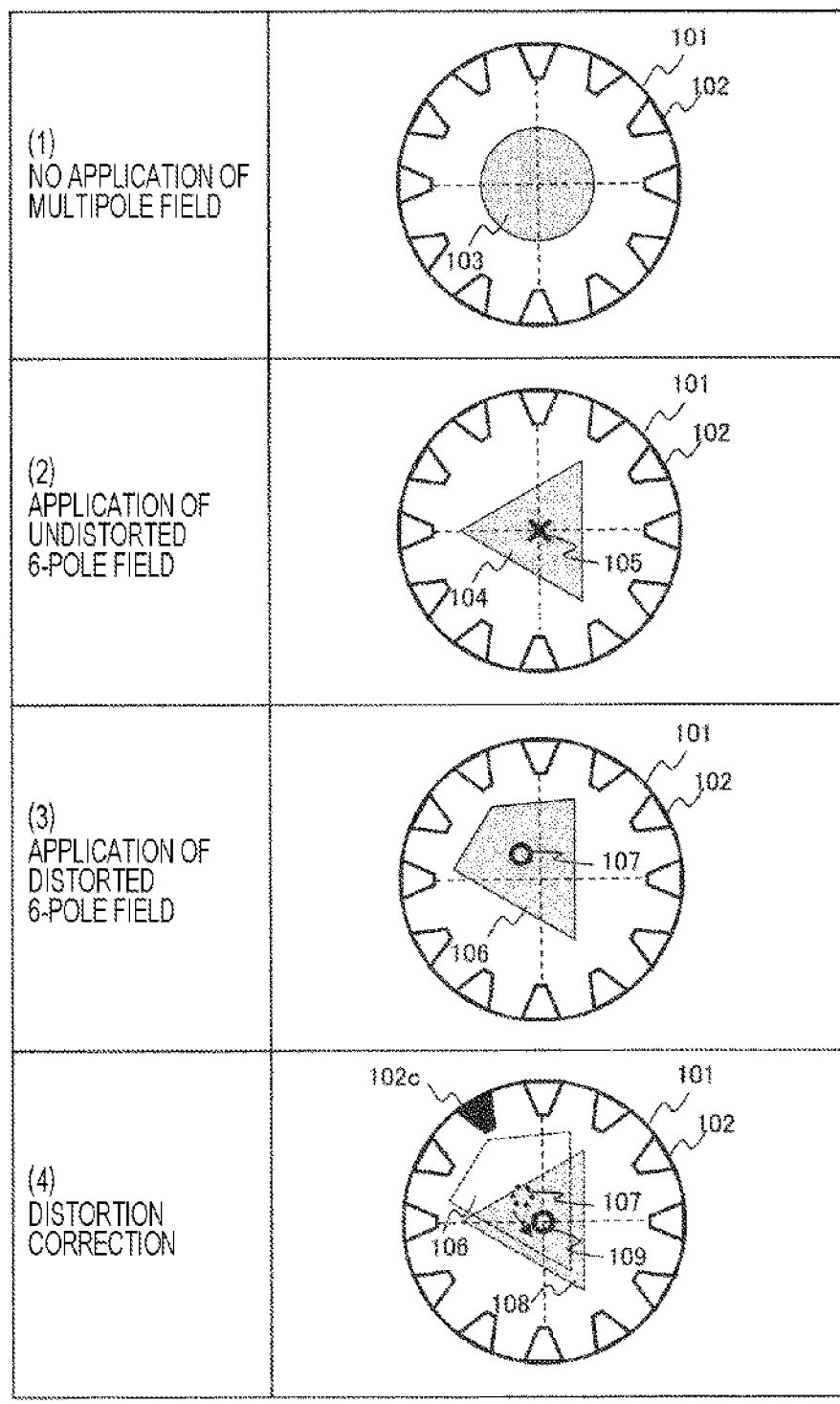
FIG. 1 is a diagram for describing a correction method of distortion of a multipole.

A method of correcting a parasitic field due to distortion of multipoles in the present embodiment will be described with reference to FIG. 1. An aberration corrector includes multipoles stacked in multiple stages. FIG. 1 illustrates a beam shape of primary electrons (electron beam) passing through multipole 101 of any one stage constituting the aberration corrector. However, it is difficult to accurately illustrate the beam shape of the electron beam, and the beam shape is schematically illustrated.

A first stage (uppermost stage) of FIG. 1 illustrates a state without application of a multipole field. An electron beam 103 passes through a central axis of the multipole 101, and a beam shape of the electron beam 103 at this time is circular.

The multipole 101 in this example has 12 poles 102, and the multipole fields can be generated in a superimposed manner by controlling the magnitude of an electric field (when the poles are electrodes) or a magnetic field (when the poles are magnetic poles) generated by each of the 12 poles 102. The beam shape of the electron beam is deformed by the action of the multipole field generated by the multipole. Assuming that the beam shape without aberration is a perfect circle, an electron beam having a beam shape deformed from the perfect circle is actually incident on the aberration corrector due to the influence of the aberration. The aberration corrector including the multipole corrects chromatic aberration or geometric aberration by imparting reverse aberration for correcting deformation of the beam shape to the electron beam by the action of the multipole fields and causing the beam shape of the electron beam to approximate to the perfect circle (ideal shape).

A second stage of FIG. 1 illustrates a beam shape when the multipole 101 applies an undistorted 6-pole field, and a beam shape of an electron beam 104 at this time is deformed into a triangle by the action of the 6-pole field. When the multipole 101 generates the undistorted 6-pole field, since a deviation of a center of gravity of the electron beam does not occur, an observation image shift does not occur. This is illustrated in the drawing by the fact that a center of gravity 105 of the electron beam 104 is positioned at a center of the multipole 101.

A third stage of FIG. 1 schematically illustrates a beam shape when the multipole 101 applies a distorted 6-pole field. A beam shape of an electron beam 106 at this time is deformed into a polygonal shape different from a triangular shape which is an ideal shape due to the influence of the distortion, and a center of gravity 107 of the electron beam 106 is positioned at a position different from the center of the multipole 101. This indicates that the deviation of the center of gravity of the electron beam occurs due to the influence of the distortion and the observation image shift occurs. Since this distortion is caused due to manufacturing variations such as processing, assembly, and power output of the aberration corrector, the distortion cannot be avoided.

A fourth stage (lowermost stage) of FIG. 1 illustrates a distortion correction method according to the present embodiment. In the distortion correction method of the present embodiment, attention is paid to an observation image shift caused by distortion. A non-uniform field is superimposed by adjusting the magnitude of an electric field or a magnetic field generated by some poles (here, pole 102c) of the 12 poles 102, and thus, a center of gravity 109 of a beam shape of an electron beam 108 is positioned at the center of the multipole 101. As a result, the distortion derived from the manufacturing variation is canceled by the non-uniform fields, and the beam shape of the electron beam 108 also becomes the triangular shape which is the ideal shape. Note that, although the example in which the number of poles to be adjusted is one has been described, the number of poles to be adjusted may be singular or plural depending on the non-uniform field to be generated.

Note that, although the example of the 6-pole field has been described, the same applies to a 4-pole field and an 8-pole field. There are two types of aberration correctors, a magnetic field type and an electrostatic type classified by a type of the pole, but an effect can be obtained for both the types.

The multipole field to be generated by the multipole for aberration correction does not cause movement of the observation image unless there is no distortion of the multipole. In the present embodiment, correction for generating the non-uniform field is performed so as to eliminate the movement of the observation image for the multipole field actually generated at the time of observation for each multipole field for each multipole by using this property. Thus, it is possible to accurately eliminate the influence of the distortion of the multipole.

Figure 2:
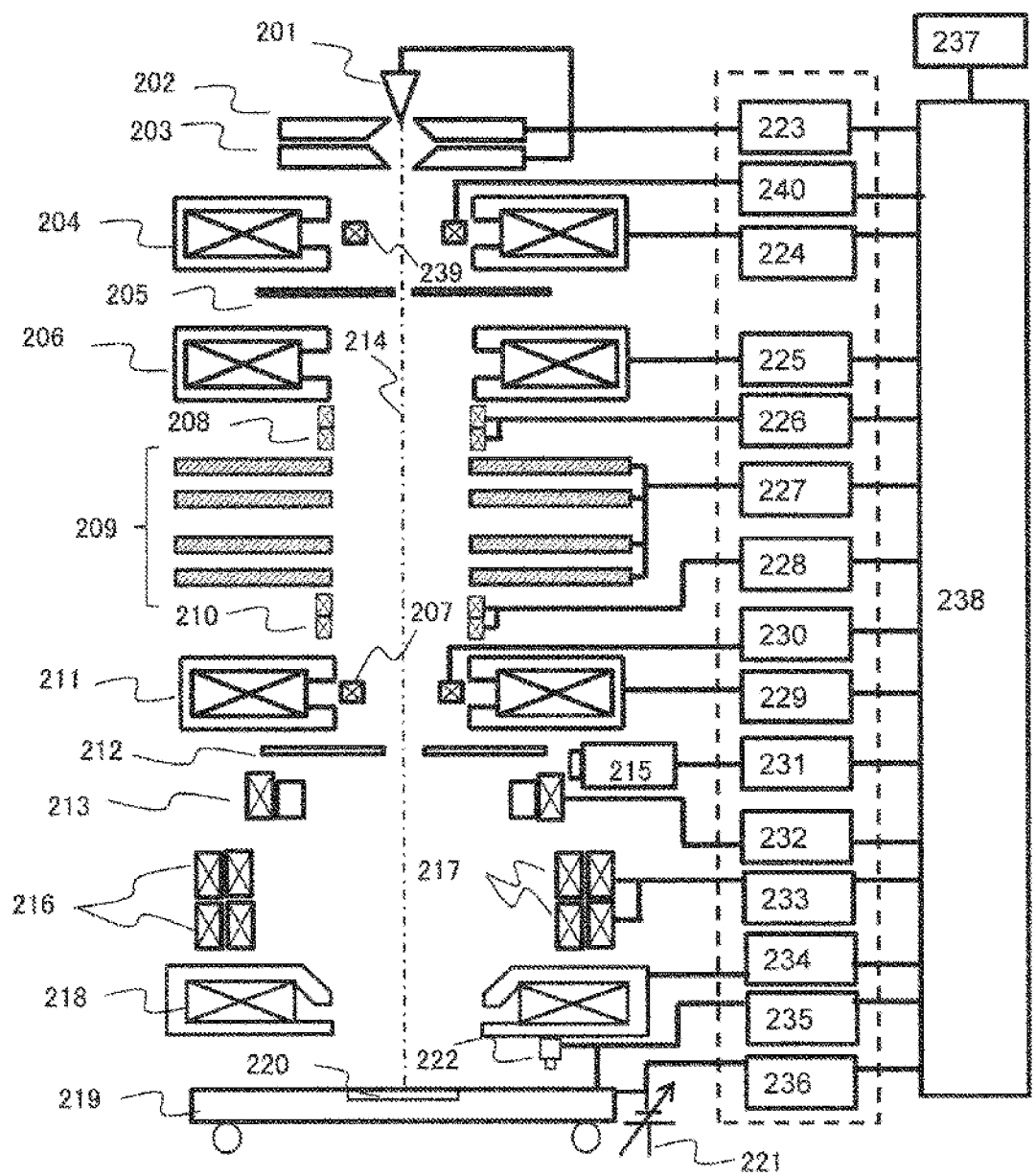
FIG. 2 is a schematic diagram of a scanning electron microscope having an aberration corrector mounted thereon.

FIG. 2 is a schematic diagram of a scanning electron microscope having an aberration corrector mounted thereon. A cathode 201, a first anode 202, and a second anode 203 constitute a charged particle source (electron gun), and are controlled by an electron gun controller 223. The electron gun controller 223 applies an extraction voltage between the cathode 201 and the first anode 202, and thus, primary electrons are emitted from the cathode 201 at a predetermined current density. The primary electrons are accelerated and emitted to the subsequent stage by an acceleration voltage applied between the cathode 201 and the second anode 203.

The emitted primary electrons are focused by a first condenser lens 204 of which an excitation current is controlled by a first condenser lens controller 224. The primary electrons focused by the first condenser lens 204 are limited to a predetermined current amount at an opening of an objective movable stop 205. The primary electrons having passed through the objective movable stop 205 is adjusted to a beam trajectory parallel to an optical axis by a second condenser lens 206 of which an excitation current is controlled by a second condenser lens controller 225.

The primary electrons having passed through the second condenser lens 206 are incident on an aberration corrector 209, and are adjusted to an electron trajectory for correcting chromatic aberration, geometric aberration, or both the chromatic aberration and the geometric aberration. The excitation current and the applied voltage of the aberration corrector 209 are controlled by an aberration corrector controller 227. The primary electrons having passed through the aberration corrector 209 are focused at an appropriate position on an optical axis 214 by a third condenser lens 211 of which an excitation current is controlled by a third condenser lens controller 229. The primary electrons focused by the third condenser lens 211 are focused on a wafer 220 disposed on a stage 219 by an objective lens 218 of which an excitation current is controlled by an objective lens controller 234. The excitation current of the objective lens 218 is set based on a working distance measured by a sample height measuring instrument 222 controlled by a stage controller 235.

A retarding power supply 221 controlled by a retarding voltage controller 236 is connected to the stage 219. The primary electrons are decelerated by generating a voltage between the objective lens 218 and the wafer 220 with the retarding power supply 221.

The primary electrons are two-dimensionally scanned on the wafer 220 by a first scanning deflector 217 controlled by a first deflector controller 233. Secondary electrons are generated by an interaction between the primary electrons and the wafer 220. The generated secondary electrons pass through the objective lens 218 and form a spread spot on a secondary electron conversion plate 212. The secondary electrons are scanned on the secondary electron conversion plate 212 by the first scanning deflector 217, and tertiary electrons are generated by an interaction with the secondary electron conversion plate 212. The tertiary electrons are deflected in a direction of a detector 215 controlled by a detector controller 231 by an E×B deflector 213 of which the applied voltage and the excitation current are controlled by an E×B controller 232, and are detected by a detector 215. The detected tertiary electrons are converted into an electric signal, are calculated by the controller 238, and are displayed as a SEM image on a display device 237. When a field of view of the SEM image is moved, the stage 219 is moved by the stage controller 235, or an irradiation position of the primary electrons on the wafer 220 is moved by an image shift deflector 216 controlled by the first deflector controller 233.

When a central axis of the aberration corrector 209 is deviated from the optical axis 214, the primary electrons incident on the aberration corrector 209 are aligned with an optical axis 150 by a two-stage deflector 208 controlled by a second deflector controller 226, and the primary electrons emitted from the aberration corrector 209 are aligned with the optical axis 150 by a two-stage deflector 210 controlled by a third deflector controller 228.

An astigmatism corrector 207 controlled by an astigmatism corrector controller 230 corrects a parasitic astigmatism of an electron optics system.

The aberration corrector 209 is an aberration corrector constructed by stacking the multipoles illustrated in FIG. 1 in multiple stages, and can correct chromatic aberration and geometric aberration. For example, in the case of a 4-pole and 8-pole aberration corrector, predetermined 4-pole and 8-pole electromagnetic fields are formed by the multipoles of the stages of the aberration corrector 209. When 12 poles (electrodes and magnetic poles) are used as the multipoles, dipole, 6-pole, and 12-pole electromagnetic fields can be generated in a superimposed manner in addition to the 4-pole and 8-pole field.

Note that, the charged particle beam device equipped with the aberration corrector of the present embodiment is not limited to the scanning electron microscope illustrated in FIG. 2, and can also be applied to a scanning transmission electron microscope, a transmission electron microscope, a scanning ion microscope, a focused ion beam device, and the like.

Figure 3A:
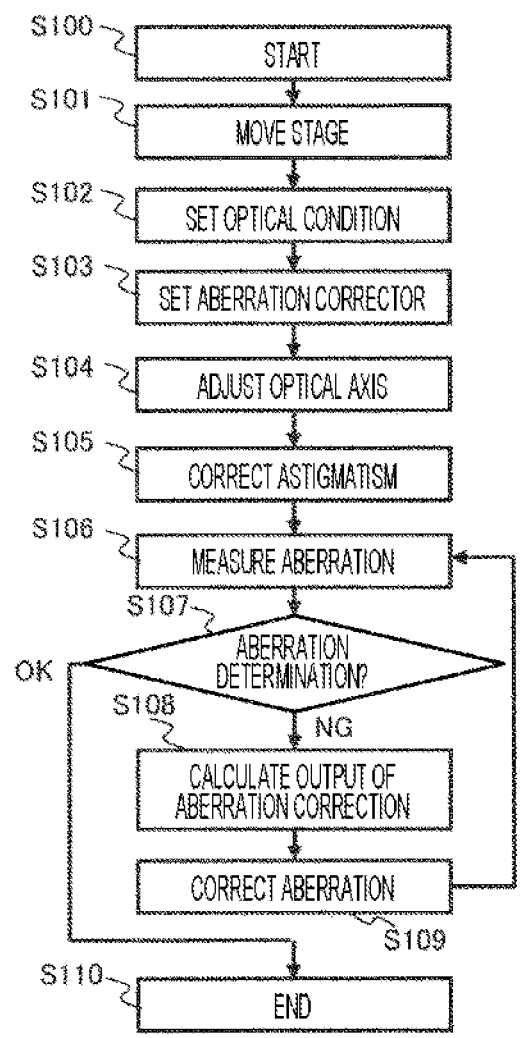
FIG. 3A is a flowchart of aberration correction by the aberration corrector.

FIG. 3A illustrates a flowchart of aberration correction by the aberration corrector 209 executed by the controller 238. A timing at which the aberration correction according to this flow is performed is not particularly limited. The timing is not limited to a timing before the start of dimension measurement or defect inspection, and examples thereof include a timing at which an optical condition such as an acceleration voltage is changed, a timing at which an atmospheric pressure or a temperature is greatly changed, and the like.

The aberration correction is started (step S100), and first, the stage controller 235 moves the stage 219 to an observation position (step S101). When an adjustment sample for measuring aberration to be described later is mounted, as a standard sample, on the stage 219, the stage 219 is moved such that the adjustment sample enters the field of view of the SEM.

In step S102, an optical condition for acquiring the SEM image is set. The optical condition includes the acceleration voltage controlled by the electron gun controller 223, the retarding voltage controlled by the retarding voltage controller 236, the excitation currents of the condenser lens controlled by the condenser lens controller 224, 225, and 229, the excitation current of the objective lens controlled by the objective lens controller 234, and the excitation currents of various deflectors.

In step S103, the correction current or the correction voltage of the aberration corrector 209 is set according to the set optical condition.

In step S104, the center axis of the aberration corrector 209 and the optical axis 214 are adjusted so as to be aligned by the two-stage deflector 208 provided on the electron beam incident side of the aberration corrector 209 and the two-stage deflector 210 provided on the electron beam emission side.

In step S105, the astigmatism is corrected by the aberration corrector 209 in order to increase the sharpness of the SEM image.

In step S106, for example, the aberration is measured from the SEM image of the adjustment sample. A known measurement method can be used to measure the aberration. Whether it is determined whether or not the measured aberration is equal to or less than a target aberration amount (step S107), and when the measured aberration is equal to or less than the target aberration amount, the flow of the aberration correction is ended (step S110). On the other hand, when the aberration amount is greater than the target aberration amount, a value of the correction current or the correction voltage applied to each pole of the multipole constituting the aberration corrector is calculated according to the magnitude of the aberration. The current value or the voltage value at this stage is the value of the correction current or the correction voltage at which the multipole does not have distortion, that is, generates a theoretically defined multipole field (step S108).

FIG. 4 illustrates the type of the multipole field to be generated in each multipole by the aberration corrector 209 for aberration correction. Each row indicates the chromatic aberration or the geometric aberration corrected by the aberration corrector 209, and corrects a primary aberration to a tertiary aberration. Each row illustrates the stage of the multipole. In this example, in order to correct the primary to tertiary chromatic aberrations or the primary to tertiary geometric aberrations listed as aberration names, it is necessary to generate the pole field surrounded by a frame 401 in a superimposed manner in the first-stage multipole. Since a ratio of the magnitude of the multipole field to be corrected is theoretically determined for each chromatic aberration or geometric aberration of a predetermined order, the correction current or the correction voltage applied to each pole can be theoretically calculated according to the magnitude of each aberration to be corrected. However, with this theoretical value, an effect of sufficient aberration correction cannot be obtained due to the influence of the distortion of each multipole of the aberration corrector 209.

In step S109, the correction current or the correction voltage applied to each pole of the multipole constituting the aberration corrector is corrected so as to remove the influence of the distortion of the multipole (hereinafter, this correction is referred to as "distortion correction"). Details of this step will be described later. Thereafter, the aberration is measured by the aberration corrector 209 after distortion correction (step S106). The distortion correction of the aberration corrector 209 is repeatedly executed until the measured aberration is equal to or less than the target aberration amount. Note that, when it is finally determined that the aberration measured in step S106 is equal to or less than the target aberration amount, it is desirable that the condition of the aberration corrector is recorded.

Figure 3B:
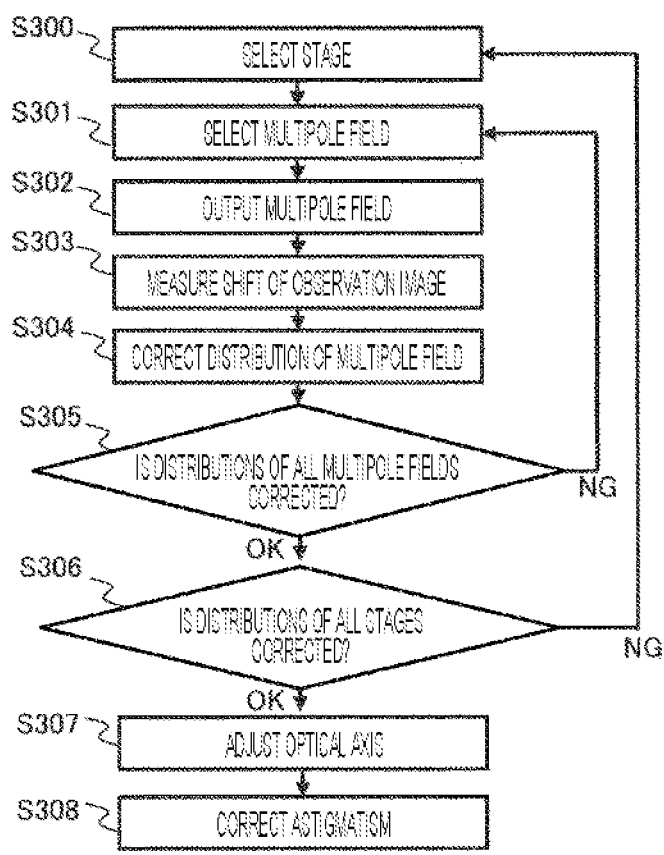
FIG. 3B is a detailed flowchart of step S109.

FIG. 3B illustrates a detailed flowchart of step S109. First, the multipole for correcting parasitic aberration is selected (step S300). For example, the first-stage multipole is selected. Subsequently, the multipole field output from the multipole is selected (step S301). For example, one of the multipole fields (see FIG. 4) included in the frame 401, for example, an oblique 4-pole field for correcting an aberration ImA1 is selected. Subsequently, the correction current or the correction voltage calculated in step S108 (see FIG. 3A) is applied to each pole of the first-stage multipole, and the oblique 4-pole field for correcting the aberration ImA1 is generated (step S302).

In step S303, the shift of the observation image due to the generation of the oblique 4-pole field for correcting the aberration ImA1 is detected. When there is no distortion of the first-stage multipole, the generated oblique 4-pole field only deforms the beam shape and does not cause the shift of the observation image. Thus, in step S304, a distribution of the multipole field is corrected so as to eliminate the shift of the observation image. Specifically, a non-uniform field having a direction and a size in which the center of gravity of the observation image is moved to the center of the multipole may be superimposed. Thus, the controller 238 holds, in a tabular form (table), a positional deviation of the center of gravity before and after the application of the multipole field and a correction amount of the correction current or the correction voltage to be applied to each pole in order to correct the positional deviation. Such correction of the distribution of the multipole field is repeated for all the multipole fields to be generated by the multipole (step S305). As a result, in the example of FIG. 4, the correction current or the correction voltage for which the distortion is corrected is obtained such that the shift of the observation image does not occur when the multipole field is applied for each of the eight types of multipole fields to be generated by the first-stage multipole. When the distortion correction is ended for all the multipole fields to be generated by the first-stage multipole, the distribution correction is similarly executed for each of the multipole fields for the other stages (step S306).

In the example of the first-stage multipole, the sum of the correction currents or the correction voltages applied to the poles obtained in step S305 for the eight types of multipole fields is applied to the poles, and thus, the eight types of multipole fields in which the distribution of the multipole field is corrected are generated in a superimposed manner.

Thereafter, the correction current or the correction current for which the distortion is corrected is set in the aberration corrector 209, and the adjustment of the optical axis (step S307) and the correction of astigmatism (step S308) are performed. These steps are the same processing as steps S104 and S105 in FIG. 3A, respectively.

Note that, as the observation image in step S303, a sample pattern (for example, a pattern of the adjustment sample) image may be used, or an electron source image may be used. When the sample pattern image is used, since the sample pattern image can be obtained by two-dimensionally scanning the electron beam by the first scanning deflector 217, the shift of the observation image is obtained from the movement of the center of gravity of the sample pattern before and after application of the multipole field. Since the shift of the observation image is obtained from the movement of the center of gravity of the sample pattern, highly accurate measurement can be performed. On the other hand, when the electron source image is used, the electron beam is scanned on the objective movable stop 205 by a second scanning deflector 239 controlled by a second scanning deflector controller 240. At this time, the primary electrons that can reach the wafer 220 are limited to the shape of the objective movable stop 205. When there is no aberration, the electron source image having the shape of the objective movable stop 205 is observed, and when there is aberration, the electron source image distorted by the aberration is observed. The shift of the observation image is obtained from the movement of the center of gravity of the electron source image before and after the application of the multipole field. As described above, the distribution of the multipole field can be measured from the SEM image by using either the observation image of the sample pattern or the electron source image.

Figure 5:
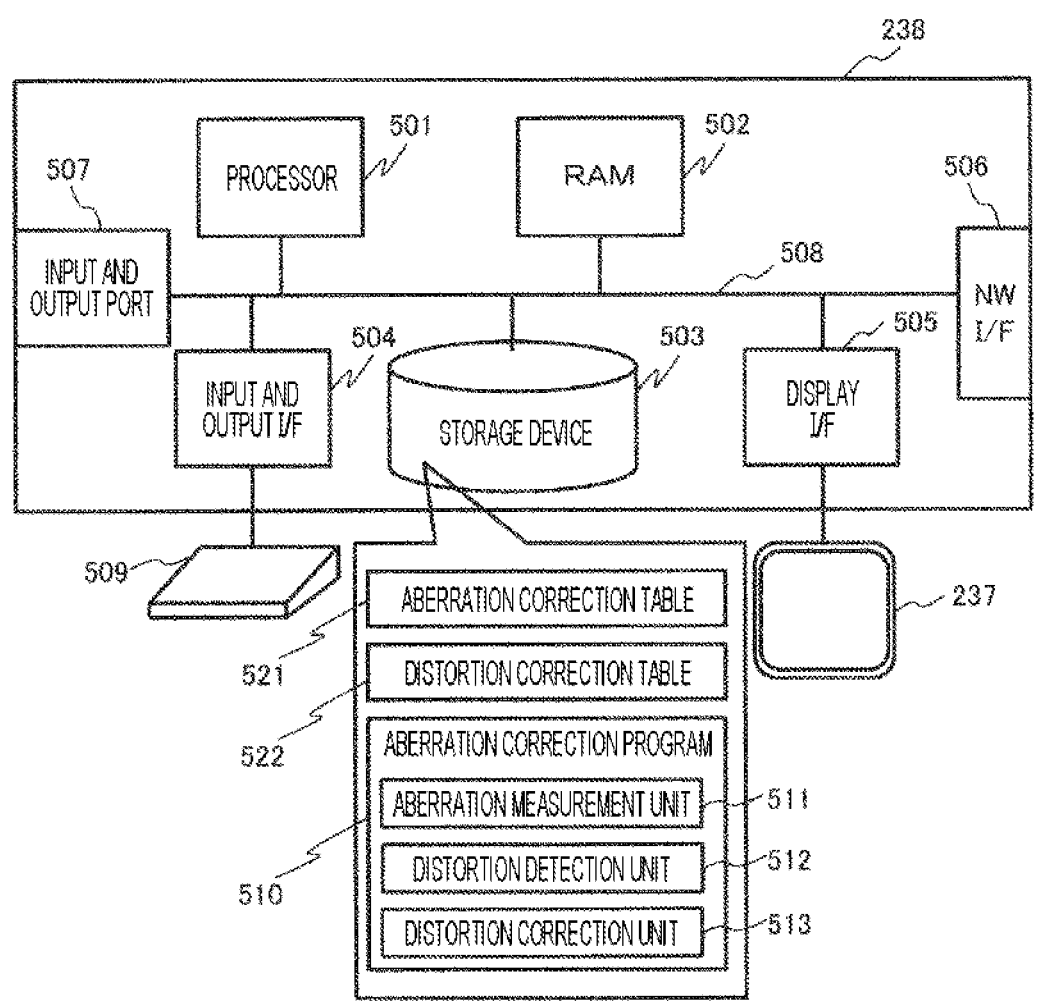
FIG. 5 is a hardware configuration example of a controller.

FIG. 5 illustrates a hardware configuration example of the controller 238. The controller 238 includes a processor 501, a random access memory (RAM) 502, a storage device 503, an input and output interface 504, a display interface 505, a network interface 506, and an input and output port 507, which are communicably coupled by a bus 508. A graphical user interface (GUI) is realized by connecting the input and output interface 504 to an input device 509 such as a keyboard and a pointing device and connecting the display interface 505 to the display device 237. Note that, an instruction of the user may be able to be input by voice in addition to the input device 509. The network interface 506 is an interface for connecting to a network. It may be possible to transmit and receive commands and image data acquired by the charged particle beam device from another terminal (not illustrated) connected via a network. The input and output port 507 is connected to a charged particle optical system of the charged particle beam device illustrated in FIG. 2, a controller of a device constituting the detector, and a sensor (for example, a barometer or the like) provided in the charged particle beam device, and transmits and receives commands and sensing data.

The storage device 503 is usually constituted by a non-volatile memory such as a hard disk drive (HDD), a solid state drive (SSD), a read only memory (ROM), or a flash memory, and stores a program executed by the controller 238, a table necessary for executing the program, image data acquired by the charged particle beam device, and the like. The RAM 502 temporarily stores a program, data necessary for executing the program, and the like according to a command of the processor 501. The processor 501 executes a program loaded from the storage device 503 into the RAM 502.

The storage device 503 stores a program for controlling the charged particle beam device, control data, and image data, but only programs and control data particularly related to the present embodiment are illustrated here. An aberration correction program 510 is a program that executes the flow illustrated in FIGS. 3A and 3B, and illustrates, as routines, an aberration measurement unit 511 (executing the processing of step S106), a distortion detection unit 512 (executing the processing of step S303), and a distortion correction unit 513 (executing the processing of step S304).

An aberration correction table 521 is a table used in step S108, and is a table for theoretically calculating the correction current or the correction voltage to be applied to the aberration corrector 209 in order to correct the aberration measured by the aberration measurement unit 511. A distortion correction table 522 is a table used in step S304, and is a table for calculating the correction amount of the correction current or the correction voltage for correcting the shift of the observation image detected by the distortion detection unit 512.

Note that, in the distortion correction, it is necessary to generate the non-uniform field so as to move the center of gravity of the observation image to the center of the multipole. At this time, when the shift of the observation image is grasped on an orthogonal coordinate system, the correction amount can be easily converted from a movement amount, and since the distribution correction of the multipole field is performed by the fixed poles forming the orthogonal axes, the reproducibility of the distortion correction can be improved.

Figure 6:
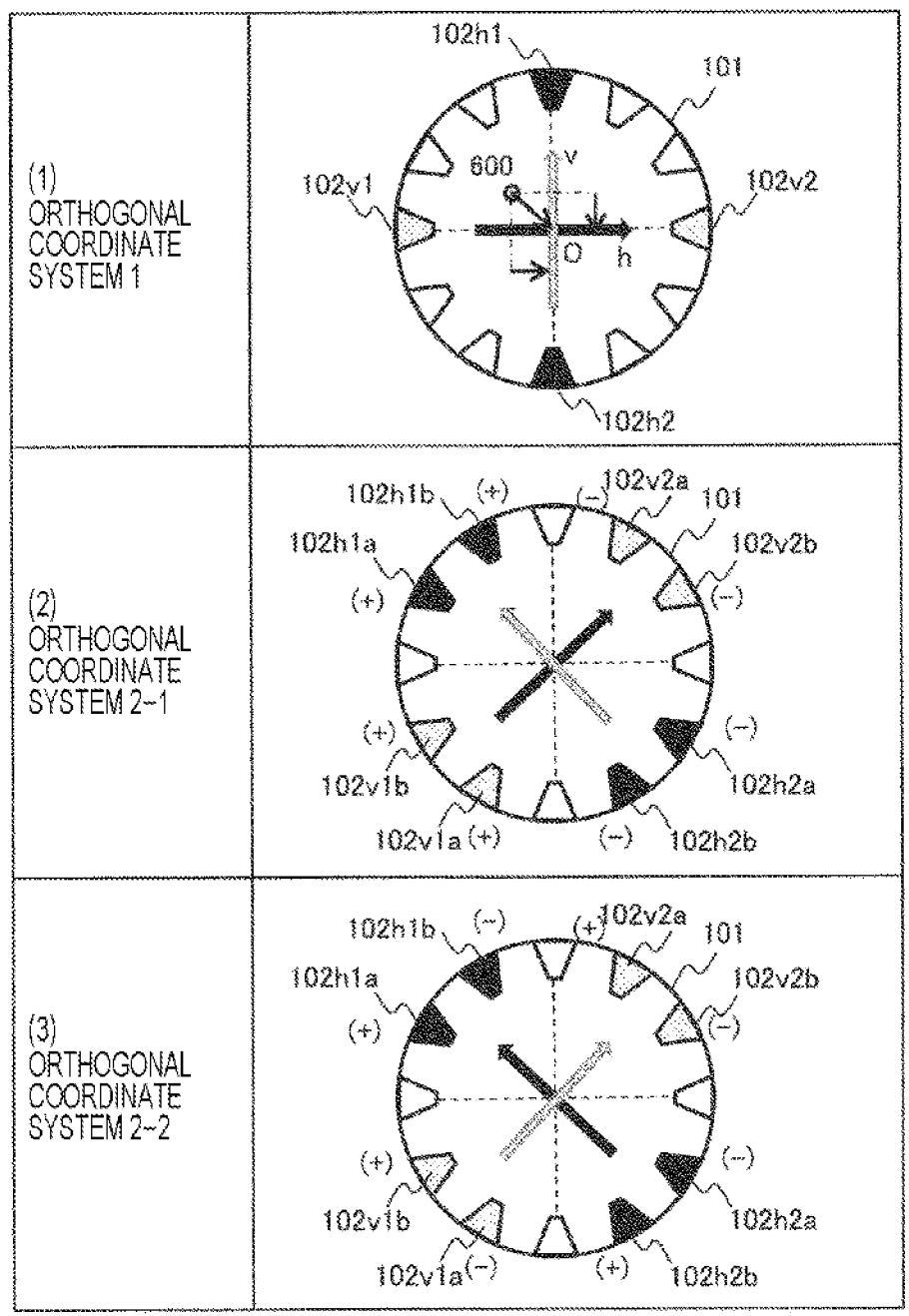
FIG. 6 is a diagram illustrating an example of an orthogonal coordinate system for performing distortion correction.

FIG. 6 illustrates an example of the orthogonal coordinate system for performing the distortion correction. As illustrated in an upper part (orthogonal coordinate system 1) of FIG. 6, the orthogonal coordinate system includes h axis (black) and v axis (gray) orthogonal to each other, and both axes intersect at a center O of the multipole. In order to move the multipole field by a vector having the center of gravity 600 of the beam shape indicating the distortion of the multipole as a start point and the center O of the multipole as an end point, it is only required to generate a non-uniform field in the h-axis direction and the v-axis direction with the size projected on the h-axis and the v-axis. A pole that generates a non-uniform field in an h-axis direction is a pole pair of a pole 102$h$1 and a pole 102$h$2, and a pole that generates a non-uniform field in a v-axis direction is a pole pair of a pole 102$v$1 and a pole 102$v$2.

The orthogonal coordinate system 1 is an example in which the axial directions coincide with each other on a straight line connecting opposite poles, but the axial directions may be arranged between adjacent poles. Such an example is illustrated as orthogonal coordinate systems 2-1 and 2-2. In the orthogonal coordinate systems 2-1 and 2-2, the h axis and the v axis are interchanged. In any case, the non-uniform field in the h-axis direction is generated by four poles 102h1a, 102h1b, 102h2a, and 102h2b, and the non-uniform field in the v-axis direction is generated by four poles 102v1a, 102v1b, 102v2a, and 102v2b. Note that, in the orthogonal coordinate systems 2-1 and 2-2, as illustrated in the drawing, a straight line connecting pole pairs 102h1a and 102h2a and a straight line connecting pole pairs 102v1a and 102v2a are orthogonal to each other, and a straight line connecting pole pairs 102h1b and 102h2b and a straight line connecting pole pairs 102v1b and 102v2b are orthogonal to each other. The pole 102h1a and the pole 102h1b are adjacent to each other, the pole 102h2a and the pole 102h2b are adjacent to each other, the pole 102v1a and the pole 102v1b are adjacent to each other, and the pole 102v2a and the pole 102v2b are adjacent to each other. However, as illustrated in a middle part and a lower part of FIG. 6, in the case of the orthogonal coordinate system 2-1, the polarities of the adjacent poles are the same, but the polarities of the adjacent poles are opposite. The orthogonal coordinate system 1 is preferably used to correct the 6-pole field, and the orthogonal coordinate system 2-1 or 2-2 is preferably used to correct the 8-pole field.

Figure 7:
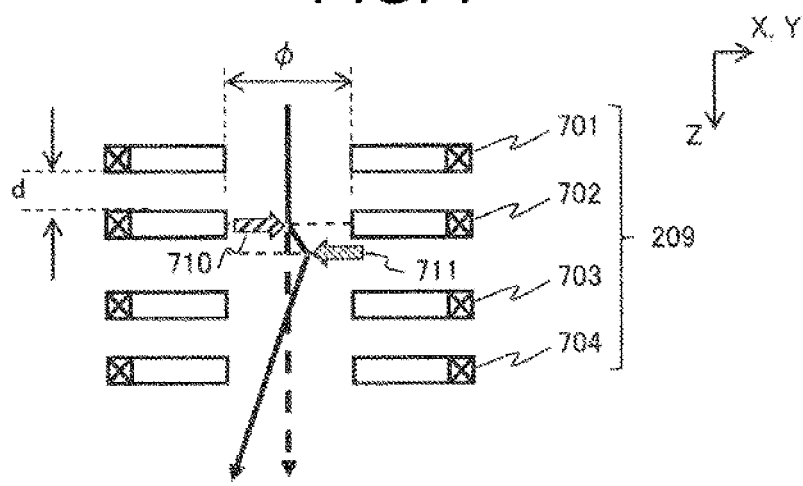
FIG. 7 is a diagram for describing a problem caused by an inter-stage interaction.

Incidentally, in the case of a small aberration corrector, an interaction (hereinafter, referred to as inter-stage interaction) between the poles of the multipoles of different stages cannot be ignored. The present problem will be described with reference to FIG. 7. In the example of FIG. 7, the aberration corrector 209 includes multipoles 701 to 704. Here, assuming that the multipoles have an inner diameter (here, refers to a diameter of a circle formed by connecting distal ends of the poles of the multipoles) $\varphi$ and adjacent multipoles have a distance d.

When the distance d has a sufficient magnitude, since there is no or negligible inter-stage interaction, a parasitic field 710 generated by the distortion of the multipole and a non-uniform field 711 for correcting the distortion act at the same position on the optical axis and cancel each other. However, due to the presence of the inter-stage interaction, an action point of the parasitic field 710 and the non-uniform field 711 is deviated in an optical axis direction (Z-axis direction). In this case, the parasitic field 710 and the non-uniform field 711 cannot cancel each other.

However, in the distortion correction method described with reference to FIG. 3B, the distortion adjustment is directly performed on the multipole field generated according to the magnitude of the aberration amount for each multipole and each multipole field, and thus, new aberration is not generated by distortion correction. Thus, the influence of the inter-stage interaction can be minimized in the distortion correction. In the aberration corrector, the influence of the inter-stage interaction appears when $5\varphi > d$, but in the distortion correction method of the present embodiment, when $d > 0.5\varphi$, the distortion correction can be performed without the influence of the inter-stage interaction.

Figure 8:
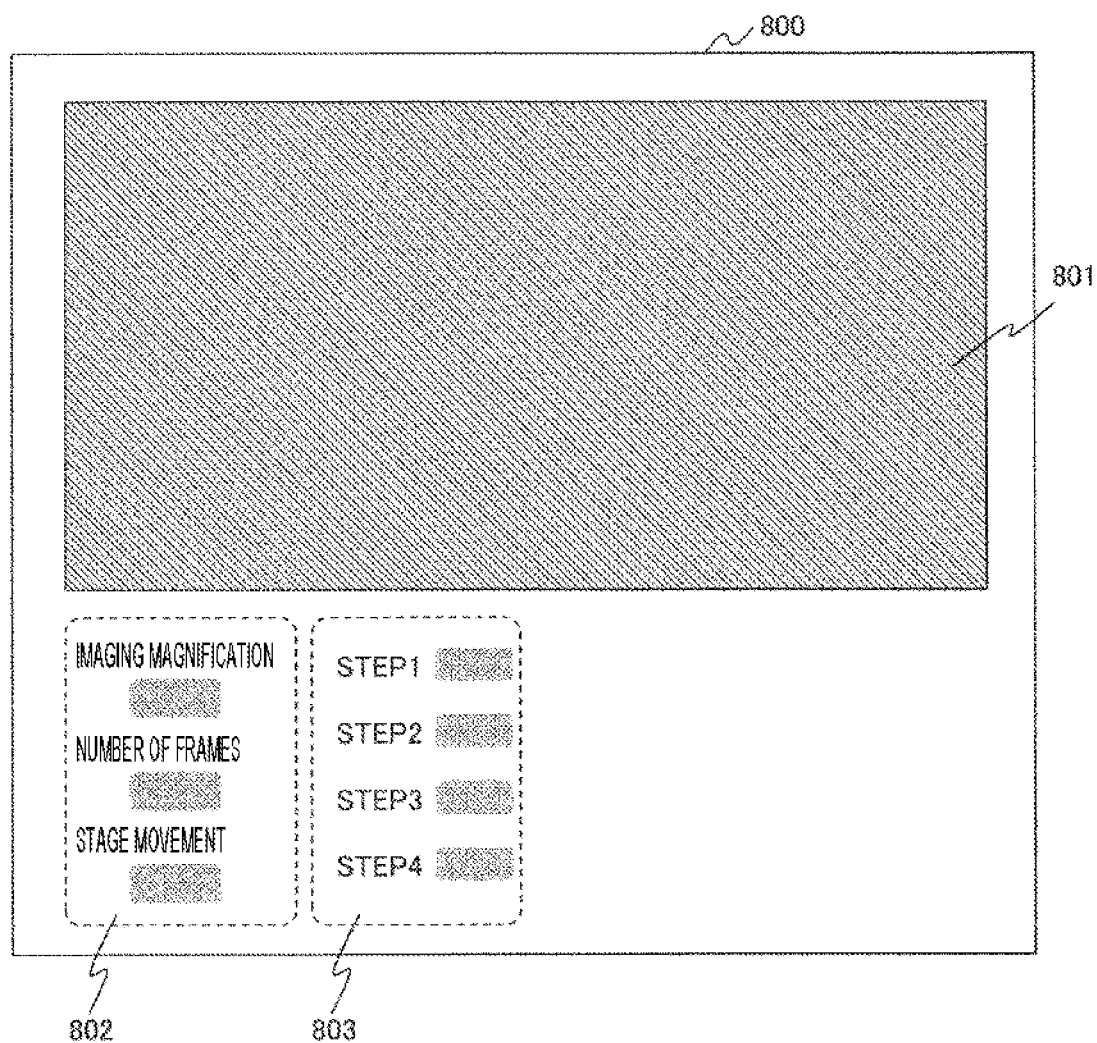
FIG. 8 is an operation screen example in a simple mode.
Figure 9:
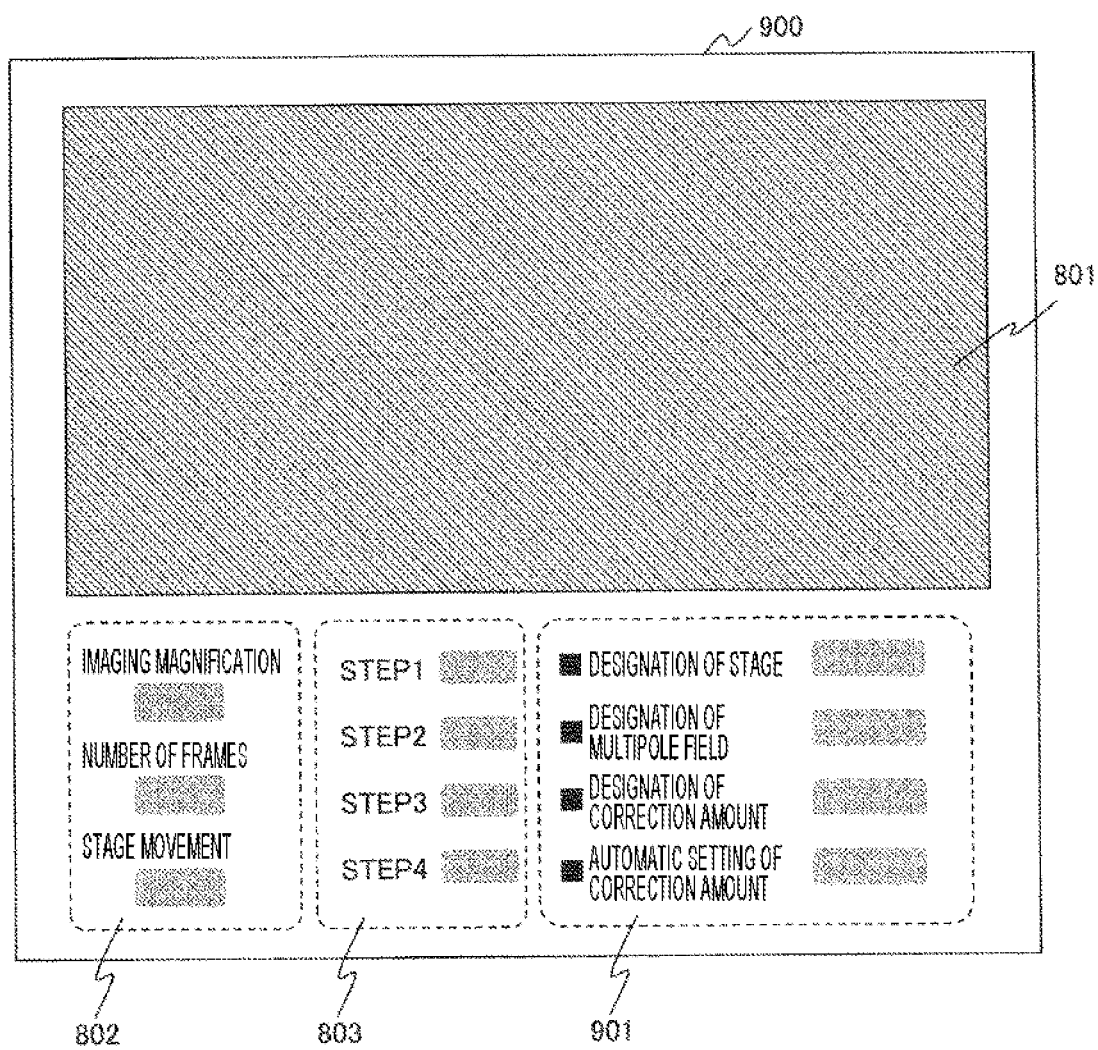
FIG. 9 is an operation screen example in a precision mode.

FIGS. 8 and 9 illustrate an example of an operation screen for performing the distortion correction according to the present embodiment. FIG. 8 is an example of an operation screen 800 in a simple mode. The operation screen 800 includes an image display region 801 for displaying the observation image, an observation condition setting region 802, and an aberration correction simple adjustment region 803. An input box for inputting, for example, an imaging magnification of the observation image, the number of imaging frames, stage movement, and the like are provided in the observation condition setting region 802. A button for advancing the flow of executing FIGS. 3A and 3B is provided in the aberration correction simple adjustment region 803. For example, STEP1 is a setting button for setting the optical condition (step S102), STEP2 is a setting button for adjusting the optical axis (step S104), STEP3 is a setting button for correcting the astigmatism (step S105), and STEP4 is a setting button for correcting the aberrations (steps S106 to S109). As a result, aberration correction requiring complicated adjustment can be easily performed according to the procedure.

FIG. 9 is an example of an operation screen 900 in a precision mode. The operation screen 900 includes an aberration correction precision adjustment region 901 in addition to the operation screen of the operation screen 800 in the simple mode. The aberration correction precision adjustment region 901 enables the user to execute the flow of FIG. 3B while appropriately manually designating the correction amount. For example, designation of the number of stages of the multipole for performing the distribution correction of the multipole field, designation of the multipole field, designation of the correction amount for the distribution correction, and automatic calculation of the correction amount for the distribution correction can be performed.

REFERENCE SIGNS LIST 101, 701 to 704 multipole
102 pole
103, 104, 106, 108 electron beam
105, 107, 109 center of gravity
201 cathode
202 first anode
203 second anode
204, 206, 211 condenser lens
205 objective movable stop
207 astigmatism corrector
208, 210 second-stage deflector
209 aberration corrector
212 secondary electron conversion plate
213 E×B deflector
214 optical axis
215 detector
216 image shift deflector
217 first scanning deflector
218 objective lens
219 stage
220 wafer
221 retarding power supply
222 sample height measuring instrument
223 electron gun controller
224, 225, 229 condenser lens controller
226 second deflector controller
227 aberration corrector controller
228 third deflector controller
230 astigmatism corrector controller
231 detector controller
232 E×B controller
233 first deflector controller
234 objective lens controller
235 stage controller
236 retarding voltage controller
237 display device
238 controller
239 second scanning deflector
240 second scanning deflector controller
501 processor
502 RAM
503 storage device
504 input and output I/F 505 display I/F
506 network I/F
507 input and output port
508 bus
509 input device
510 aberration correction program
511 aberration measurement unit
512 distortion detection unit
513 distortion correction unit
521 aberration correction table
522 distortion correction table
710 parasitic field
711 non-uniform field
800, 900 operation screen

The invention claimed is:

1. A charged particle beam device, comprising:
a charged particle optical system which irradiates a sample with a charged particle beam from a charged particle source;
a detector which detects electrons emitted by an interaction between the charged particle beam and the sample; and
a controller,
wherein the charged particle optical system includes an aberration corrector which corrects aberration of the charged particle beam and the aberration corrector has multipoles of a plurality of stages,
wherein each of the multipoles includes a plurality of poles, and generates a predetermined multipole field by applying a predetermined correction voltage or correction current to the plurality of poles,
the aberration corrector is capable of generating a plurality of multipole fields in a superimposed manner in the multipoles of the plurality of stages in order to correct the aberration of the charged particle beam, and
the controller corrects, for any one first multipole field of the plurality of multipole fields to be generated in a multipole of any stage among the plurality of stages, a value of the predetermined correction voltage or correction current to be applied to the plurality of poles of the multipole for generating the first multipole field so as to eliminate a shift of an observation image obtained based on the electrons detected from the detector by irradiating the sample with the charged particle beam before and after the first multipole field is generated;
wherein when a diameter of a circle formed by connecting distal ends of the plurality of poles of the multipole is $\varphi$ and a distance between the multipoles is d, a relationship of $5\varphi > d > 0.50$ is satisfied.

2. The charged particle beam device according to claim 1, wherein the controller controls, for each of the plurality of multipole fields to be generated in the multipoles of the plurality of stages, performs distortion correction for correcting the value of the predetermined correction voltage or correction current to be applied to the plurality of poles of the multipole for generating the multipole field such that the observation image obtained based on the electrons detected from the detector by irradiating the sample with the charged particle beam before and after the multipole field is generated is not shifted, and generates the plurality of multipole fields in a superimposed manner by applying, to the plurality of poles of each of the multipoles of the plurality of stages, a correction voltage or a correction current to which the value of the predetermined correction voltage or correction current for which the distortion correction is performed is added for each of the plurality of multipole fields to be generated in the multipole.

3. The charged particle beam device according to claim 1, wherein the controller obtains a shift of the observation image from the observation image before the first multipole field is generated and the observation image after the first multipole field is generated, and generates a non-uniform field for eliminating the shift of the observation image in a superimposed manner in the first multipole field.

4. The charged particle beam device according to claim 3, wherein
the plurality of poles of the multipole includes first pole pairs facing each other and second pole pairs facing each other, and a straight line connecting the first pole pairs and a straight line connecting the second pole pairs are orthogonal to each other, and
the controller generates the non-uniform field for eliminating the shift of the observation image by combining a first non-uniform field to be generated by the first pole pairs and a second non-uniform field to be generated by the second pole pairs.

5. The charged particle beam device according to claim 3, wherein
the plurality of poles of the multipole includes first to fourth pole pairs facing each other, a straight line connecting the first pole pairs and a straight line connecting the second pole pairs are orthogonal to each other, a straight line connecting the third pole pairs and a straight line connecting the fourth pole pairs are orthogonal to each other, each of the first pole pairs is adjacent to each of the third pole pairs, and each of the second pole pairs is adjacent to each of the fourth pole pairs, and
the controller generates the non-uniform field for eliminating the shift of the observation image by combining a first non-uniform field to be generated by the first and third pole pairs and a second non-uniform field to be generated by the second and fourth pole pairs.

6. The charged particle beam device according to claim 5, wherein polarities of the pole of the first pole pair and the pole of the third pole pair which are adjacent to each other are the same, and polarities of the pole of the second pole pair and the pole of the fourth pole pair which are adjacent to each other are the same.

7. The charged particle beam device according to claim 5, wherein polarities of the pole of the first pole pair and the pole of the third pole pair which are adjacent to each other are different, and polarities of the pole of the second pole pair and the pole of the fourth pole pair which are adjacent to each other are different.

8. The charged particle beam device according to claim 1, further comprising
a display device which displays an operation screen,
wherein the controller corrects the value of the predetermined correction voltage or correction current to be applied to the plurality of poles which generate the first multipole field for the first multipole field of the multipole of any stage designated by the operation screen.

* * * * *